United States Patent [19]
Jewell et al.

[11] Patent Number: 5,500,540
[45] Date of Patent: Mar. 19, 1996

[54] WAFER SCALE OPTOELECTRONIC PACKAGE

[75] Inventors: Jack L. Jewell; William E. Quinn; Stan E. Swirhun; Robert P. Bryan, all of Boulder, Colo.

[73] Assignee: Photonics Research Incorporated, Broomfield, Colo.

[21] Appl. No.: 228,202

[22] Filed: Apr. 15, 1994

[51] Int. Cl.[6] ............................ H01L 33/00; H01L 25/03
[52] U.S. Cl. ........................... 257/82; 257/99; 257/432
[58] Field of Search ............................. 257/678, 85, 82, 257/92, 97, 690, 707, 717, 432, 433, 434, 81, 99

[56] References Cited

U.S. PATENT DOCUMENTS

| | | | |
|---|---|---|---|
| 4,698,662 | 10/1987 | Young et al. | 257/702 |
| 4,862,231 | 8/1989 | Abend | 257/81 |
| 5,075,253 | 12/1992 | Sliwa, Jr. | 252/723 |
| 5,214,845 | 6/1993 | King et al. | 257/668 |
| 5,244,818 | 9/1993 | Jokerst et al. | 437/3 |
| 5,266,794 | 11/1993 | Olbright et al. | 257/82 |
| 5,283,447 | 2/1994 | Olbright et al. | 257/97 |
| 5,287,001 | 2/1994 | Buchmann et al. | 257/719 |
| 5,291,064 | 3/1994 | Kurokawa | 257/707 |

*Primary Examiner*—Robert P. Limanek
*Assistant Examiner*—Alexander Oscar Williams
*Attorney, Agent, or Firm*—Fisher & Associates

[57] ABSTRACT

A package and method for packaging optoelectronic or electronic components is provided in which multiple chip regions are packaged simultaneously prior to sectioning of the wafer into chips. The method and package allows micro-optic and other package elements to be integrated onto wafers on the same face as the optoelectronic or electronic devices without inhibiting the ability to make electrical contact to the devices. The package elements may be integrated to the wafer by material deposition, by spinning, or by physical mounting.

22 Claims, 10 Drawing Sheets

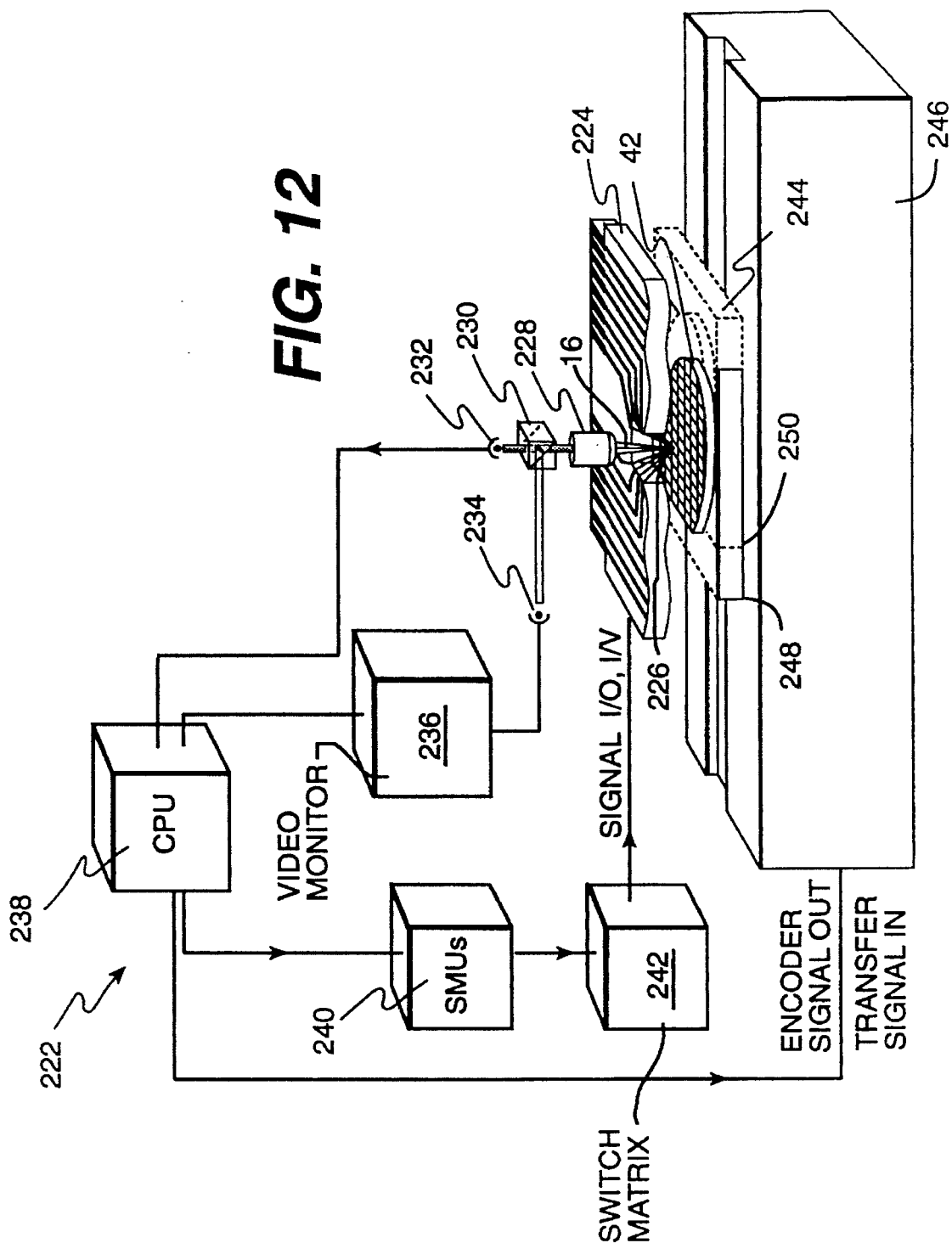

WAFER SCALE OPTOELECTRONIC PACKAGE

CROSS-REFERENCE TO RELATED DOCUMENTS

This application addresses the subject matter of Disclosure Document Number 347657, which was filed with the U.S. Patent and Trademark Office on Feb. 9, 1994.

BACKGROUND OF THE INVENTION

1. Field of the Invention

The present invention relates to the packaging of semiconductor chips and, more particularly, to packaging of optoelectronic chips on a wafer scale before the wafer is diced into chips. Particular emphasis is placed on integrating arrays of micro-optical elements to arrays of vertical-cavity surface-emitting lasers.

2. Description of the Prior Art

Fabrication of electronic circuits and optoelectronic devices has advanced to a state where the majority of the cost of semiconductor components lies not in the semiconductor processing, but in the packaging of the components. For electronics components, packaging typically involves electrical connection of the microscopic circuitry to macroscopic elements, e.g., pins, heatsinking, and protection from environmental hazards such as dust. Packaging of optoelectronic components such as lasers additionally involves optical elements to manipulate light emitted from or entering into the optoelectronic devices. The major reason for the high cost of semiconductor packaging relative to semiconductor processing is that the packaging is performed on a chip-by-chip basis, i.e., one component at a time. By contrast, semiconductor processing takes place on a wafer scale, a single wafer typically containing hundreds of chips. Performance of any part of the semiconductor packaging process on a wafer scale, rather than a chip scale, will greatly decrease cost and increase manufacturing throughput.

Wafer scale packaging generally involves the integration of dissimilar materials. A necessary condition is that integration of one component with another does not interfere with the operation of, or subsequent packaging of, either component. For example, with light-emitting optoelectronic devices, such as vertical-cavity surface-emitting lasers (VCSELs), integrated lenses must comprise an optically transparent material and the lenses must not prevent electrical contacting. Conventional edge-emitting semiconductor lasers are not suitable for wafer scale packaging because light propagates parallel to the wafer surface and the wafer must be cleaved, sawn or etched to complete the laser structure to allow for the propagation of this light. VCSELs emit radiation in a direction perpendicular to the wafer surface. In contrast to the elliptical and astigmatic beam quality of edge emitting lasers, VCSELs advantageously emit circularly symmetric, low divergence Gaussian beams which may be collected by lenses of simple construction. VCSELs, moreover, may be readily made into two-dimensional laser arrays as well as fabricated in extremely small sizes. Accordingly, two-dimensional VCSEL arrays have various applications in the fields of optical memory, laser printing and scanning, optical communications, optoelectronic integrated circuits, optical computing, optical interconnection, etc.

For the purposes of this application, packaging is defined as "the integration of components either comprising dissimilar materials or having separate fabrication processes on different wafers, each component undergoing fabrication processes either before, during or after the integration takes place." A package is a component which results from packaging. An example of the monolithic integration of VCSELs with transistors is disclosed by Olbright and Jewell, in U.S Pat. No. 5,283,447. Since the VCSELs and transistors comprise similar materials and are fabricated on the same wafer, the procedure is not considered to be packaging; rather, it is the fabrication of an opto-electronic integrated circuit, or OEIC.

Shifrin and Hunsperger, in U.S. Pat. No. 4,677,740, describe an opto-isolator in which Light-Emitting Diodes (LEDs) are monolithically integrated with detectors. The Shifrin and Hunsperger process also is an OEIC fabrication. In a similar manner, Ehrfeld et al., in U.S. Pat. No. 5,194,402, describes the fabrication of sensor structures on top of electronic circuits, the sensor fabrication being an extension of the electronic circuit fabrication process. Kolbas, in U.S. Pat. No. 4,532,694, describes a method by which etching and subsequent semiconductor growth and polishing on a wafer produces a material structure on which electronic and optoelectronic devices may be subsequently fabricated. The Kolbas method relates to material preparation rather than packaging.

Optoelectronic packaging often involves the integration of optoelectronic elements, such as lasers or photodetectors, with optical elements such as lenses. Slawek et al., in U.S. Pat. No. 3,704,375, describes a process in which dielectric materials are deposited onto detector elements prior to dicing the wafer into chips.

Other patents relating to packaging of LEDs and photodetectors include, for example, Spaeth et al., U.S. Pat. No. 4,875,750, which describes the etching of holes into a carrier chip substrate and subsequent placement of a spherical lens within the substrate. When the carder chip is integrated to the LED chip, the lens directs the light emitted from the LED. Integrated packaging on a scale beyond the chip level is not disclosed or suggested.

Packaging on a scale greater than one element at a time is very limited in the prior art and it is usually performed on the side of the wafer opposite to the side on which the LEDs are fabricated. An example of this type of packageing is taught by Cina et al., in U.S. Pat. No. 5,042,709. Cina et al. describe a process for packaging arrays of lasers and arrays of fibers which requires mounting both lasers and fibers to a third substrate. The Cina et al. process is not applicable for two-dimensional, i.e., full wafer scale, packaging. The Cina et al. process also requires a complicated dicing procedure.

Haitz, in U.S. Pat. No. 5,087,949, describes the sawing of grooves on the back side of an LED wafer to create multiple planar refracting surfaces which directs light, emitted through the substrate, in a preferred direction. Buckley and Ostermayer, in U.S. Pat. No. 4,391,683, describe the use of photoetching for the formation of lenses on the back sides of LED wafers to enhance coupling of the light into optical fibers. In both Haltz and Buckley, optical elements are formed into the LED substrate material on the back side of the substrate. No integration of dissimilar materials or separate fabrication processes is disclosed and therefore, the process is not a packaging process.

Heinen, in U.S. Pat. Nos. 4,740,259 and 4,841,344, describes the adhesive mounting of spherical lenses onto mesas etched on the back side of an LED wafer. Separation into individual LEDs is performed after the lenses are mounted. In Heinen's apparatus, the spherical lenses are fabricated separately before mounting on a vacuum holding apparatus. There is no described means for mounting the spherical lenses on the holding apparatus, nor is it at all obvious to one skilled in the art as to whether large numbers of lenses may be mounted simultaneously.

Jokerst et al., in U.S. Pat. No. 5,244,818, describe a liftoff process in which separately fabricated devices may be integrated by lifting devices off one substrate and bonding them to another. Jokerst et al. neither disclose nor suggest dicing the resultant hybrid structure into chips after the integration. Furthermore, it is not clear whether the Jokerst et al. process is extensible to wafer-scale integration, mainly due to the difficulties encountered for maintaining precise alignment over large wafer areas, especially if the wafers have different coefficients of thermal expansion.

Liftoff is also described by Fossum et al., in U.S. Pat. No. 5,236,871; however, Fossum et al. does not describe or suggest wafer-level integration or any means for achieving such integration.

The prior art relating to the integrated packaging of optoelectronic components is found to be severely restricted. In many cases, the packaging is performed on the back side of the wafer, necessitating that the wafer material be transparent to the wavelength of the emitted light, thereby restricting the materials/wavelengths combinations for which the techniques are applicable. Furthermore, since electrical contacting on the back side of the wafer is minimal, no techniques are disclosed or suggested for maintaining or improving the ability to electrically contact the wafer after the optical elements are integrated. In no circumstance are components having substantially planar surfaces integrated to optoelectronic or electronic wafers on a wafer scale with full generality of top side and back side integration.

SUMMARY OF THE INVENTION

The present invention relates to the packaging of optoelectronic and electronic devices beyond the chip level and, more particularly, to the packaging of VCSELs with micro-optical components on a wafer scale. The invention is generally applicable to optoelectronic wafers and optical components, electronic wafers and other components, such as heatsinks.

In one embodiment of the invention, optical components are integrated to the wafer by depositing the optical material, forming the optical components, then removing the optical material over the electrical contact and chip separation regions.

In another embodiment of the invention, optical components are first formed on an optical wafer or frame, then mounted onto the optoelectronic wafer with subsequent removal, if necessary, of material over the electrical contact and chip separation regions.

In still another embodiment of the invention, electronic components on an electronic wafer are mounted onto the optoelectronic wafer, with subsequent removal of material over the electrical contact and chip separation regions.

In yet another embodiment of the invention, heatsinking components are first formed on a wafer or frame, then mounted onto the optoelectronic or electronic wafer with subsequent removal, if necessary, of material over the electrical contact and chip separation regions.

Other objects and features of the present invention will be apparent from the following detailed description of the preferred embodiment.

BRIEF DESCRIPTION OF THE DRAWINGS

The invention will be further described in conjunction with the accompanying drawings, in which:

FIG. 12 is an isometric view of an optoelectronic wafer package testing apparatus for characterizing the pre-packaged chip regions prior to sectioning of the optoelectronic wafer into chips.

DETAILED DESCRIPTION OF THE PREFERRED EMBODIMENTS

Figure 1:
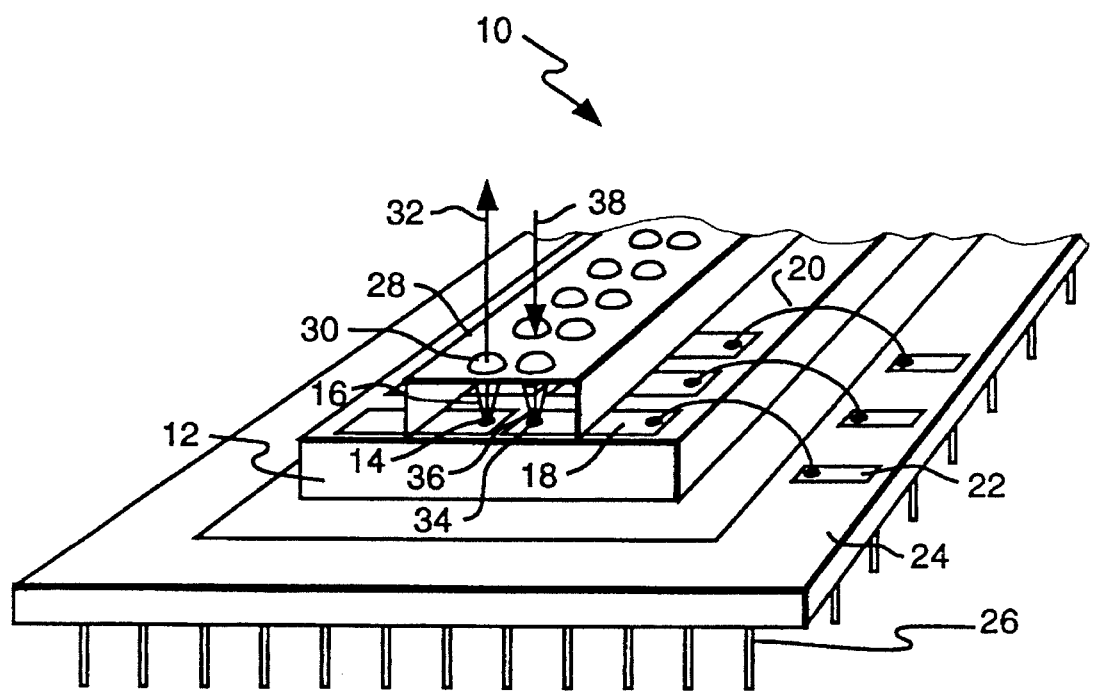
FIG. 1 is an isometric sectional view of a vertical-cavity surface-emitting laser array chip with an integrated microlens array.

With reference to the Figures, wherein like reference characters indicate like elements throughout the several views and, in particular, with reference to FIG. 1, there is shown a sectional view of an advanced optoelectronic chip package, generally denoted 10. Optoelectronic chip 12 comprises optoelectronic elements 14 which emit or receive beams of light 16. Exemplary optoelectronic devices are detectors, light modulators, LEDs, lasers and VCSELs. Optoelectronic devices are generally constructed from semiconductor materials. Electrical contacts 18 provide for wire bond electrical connections 20 to metallic strips 22 on macroscopic package 24. It should be appreciated that known electrical contacts include, but are not limited to: wirebond pads, vias to bottom, bump bonds, and TABs. Macroscopic package 24 in turn electrically connects to standard electrical components through pins 26. Integrated to optoelectronic chip 12 is an optical chip 28 containing optical elements 30. Optical elements 30 are generally constructed from optical materials, such as glass, plastic, semiconductors or sapphire. It should be appreciated that optical elements include, but are not limited to: lenses, mirrors, prisms, gratings, fibers, lasers, frequency doublers, and diffusers. Non-optical elements inculde, but are not limited to: electrical circuits, heatsinks, CVD diamonds, and electrically-insulated metals. When optoelectronic elements 14 emit beams of light 16, beams of light 16 are modified by optical elements 30, producing modified beams 32. Optoelectronic elements 14 may also receive light, as shown by receiving optoelectronic element 34 receiving modified beam of light 36. In this case, original beam of light 38 represents an incoming beam unmodified by optical elements 30.

Figure 2:
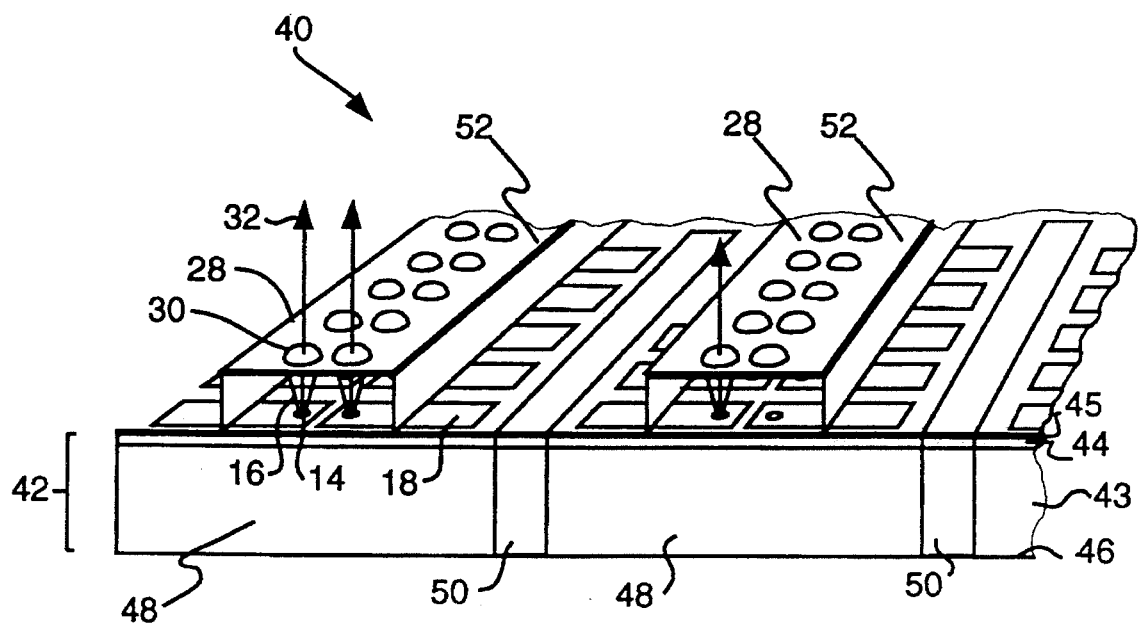
FIG. 2 is an isometric sectional view of a vertical-cavity surface-emitting laser array wafer with a microlens array integrated to each optoelectronic chip region in accordance with a preferred embodiment of the present invention.

Referring now to FIG. 2, there is shown a sectional view of wafer package 40 in accordance with the present invention. For simplicity, optoelectronic devices 14 are all shown to be light-emitting; however, it should be understood that the invention is equally valid for light receiving optoelectronic devices. Wafer package 40 comprises optical chips 28 integrated to optoelectronic wafer 42 prior to the sectioning of optoelectronic wafer 42 into optoelectronic chips. Optoelectronic wafer 42 comprises semiconductor substrate 43, device material 44, top face 45, on which the majority of semiconductor fabrication has taken place, and a bottom face 46, opposite to top face 45. Semiconductor substrate materials include, but are not limited to: GaAs, InP, Si, GaP, and sapphire. Optoelectronic devices generally, but do not necessarily, reside on top face 45. Optoelectronic chip regions 48, which will eventually comprise optoelectronic chips, are separated by optoelectronic chip separation regions 50. Electrical contacts 18 are exposed and accessible for electrical connection. Optical chips 28 do not interfere with the subsequent process of sectioning optoelectronic wafer 42 since they are not present in optoelectronic chip separation regions 50.

Wafer package 40 may be formed by a variety of processes. Optical chips 28 comprising optical material 52 may be integrated to optoelectronic wafer 42 by, for example, material deposition in a fluid or plasma state, by spin casting, or by physical mounting. For the case of material deposition by, for example, evaporation or sputtering or similar techniques, optical material 52 may be prevented from reaching optoelectronic chip separation regions 50 or electrical contacts 18, thereby allowing for sectioning of optoelectronic wafer 42 and electrical connection to electrical contacts 18. Optical material may be prevented from reaching portions of optoelectronic wafer 42 by, for example, photolithographic liftoff techniques as is well known in the art of semiconductor fabrication. Examples of optical materials which may be deposited include dielectric materials such as silicon nitride, silicon dioxide, titanium dioxide, and semiconductors such as aluminum gallium arsenide and indium phosphide. Thicknesses of optical materials 52, so deposited, are typically on the order of micrometers. It is also possible to spin cast certain glasses in a liquid state, with thicknesses as much as many tens of micrometers if multiple spins are used, onto optoelectronic wafer 42, as is also well known in the art. Photoresist, a well known class of materials in semiconductor fabrication, may also be used as an optical material and may also be spun onto optoelectronic wafer 42 to thicknesses up to many tens of micrometers. Other optical materials 52 may also be spun onto optoelectronic wafer 42. For the cases of spinning or depositing optical material 52 onto optoelectronic wafer 42, optical elements 30 will be fabricated after such spinning or deposition. When, in the process, entire optoelectronic wafer 42 is covered by deposition, spin casting, mounting, or any other means with optical material 52, optical material 52 may be advantageously removed from optoelectronic chip separation regions 50 or electrical contacts 18 by, for example, etching. It may also be possible to leave optical material 52 on optoelectronic chip separation regions 50 throughout the sectioning of optoelectronic wafer 42 into optoelectronic chips.

Figure 3:
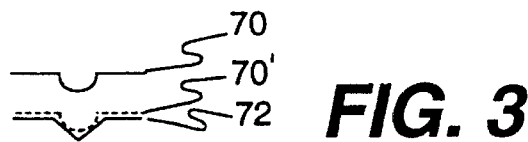
FIG. 3 is a cross-sectional view illustrating one example of a self guided projection/hole arrangement for the laser array of FIG. 3A.
Figure 3A:
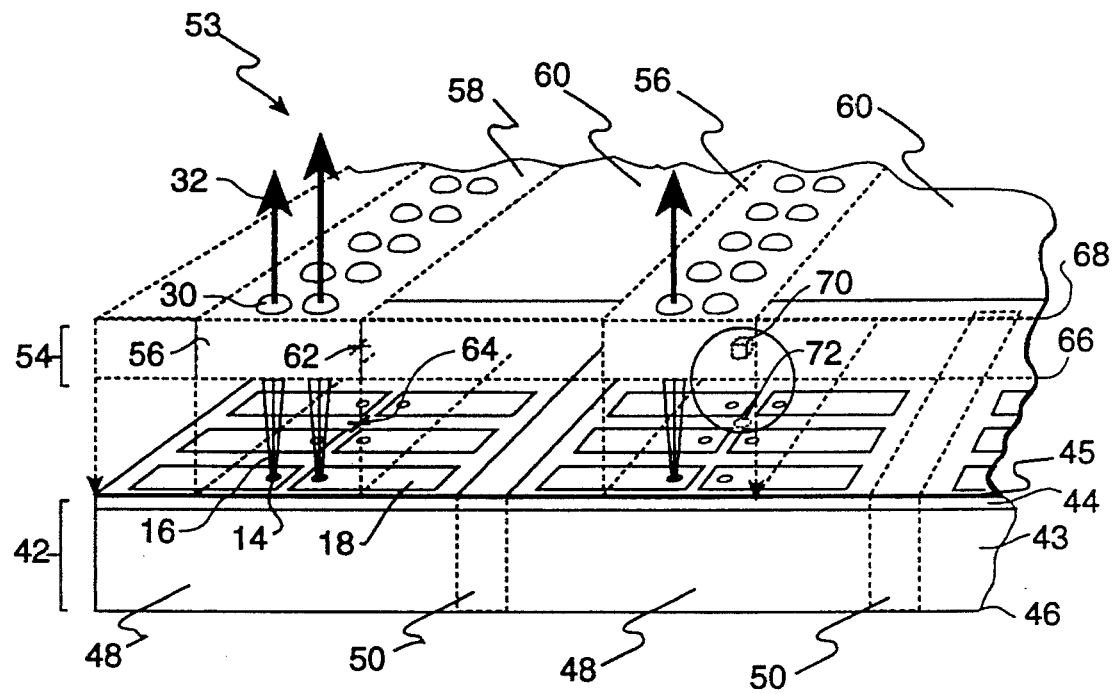
FIG. 3A is an isometric sectional view of a vertical-cavity surface-emitting laser array wafer integrated with a microlens array wafer, showing sections of the microlens array wafer to be removed.

Referring now to FIG. 3A, there is shown a means for integrating optical elements 30 to optoelectronic wafer 42 to form wafer package 53 by physically mounting optical wafer 54 onto optoelectronic wafer 42. Both optoelectronic wafer 42 and optical wafer 54 are typically a few hundred micrometers thick, however, either or both wafers could vary greatly in thickness. Optical wafer 54 comprises optical chip regions 56 made of optical material 58. Optical chip regions 56 are separated by optical chip separation regions 60 which are generally aligned with optoelectronic chip separation regions 50 or electrical contacts 18 on optoelectronic wafer 42. To facilitate alignment of optical elements 30 to optoelectronic devices 14, optical wafer alignment marks 62 may be patterned on optical wafer 54 to correspond with optoelectronic wafer alignment marks 64 of optoelectronic wafer 42. Optical wafer alignment marks 62 are preferably formed on a bottom face 66 of optical wafer 54, however they may also be formed on a top face 68 of optical wafer 54. In the context of the description of optical wafer 40, optical wafer bottom face 66 refers to the face of optical wafer 40 which mounts onto optoelectronic wafer 42. Although in the accompanying illustrations, optical elements 30 are shown to be on optical wafer top face 68, optical elements 30 may be formed on optical wafer bottom face 66 or on both faces of optical wafer 54, or within optical wafer 54.

To facilitate alignment or mounting of optical wafer 54 onto optoelectronic wafer 42, it is also possible to use projections 70 on the bottom face 66 optical wafer 54 which fit into holes 72 in optoelectronic wafer 42. It is alternatively possible to fabricate projections 70 onto optoelectronic wafer 42 and holes 72 in optical wafer 54. This projection/hole technique has advantages in that projections 70 and holes 72 may be designed such that only rough alignment needs to be performed manually; the holes then guide the projections into precise alignment. FIG. 3 illustrates one example of a self guiding projection/hole design. After mounting, projection 70 is located in position 70'. Although projections 70 and holes 72 are illustrated as being localized, it is straightforwardly possible to extend one or both of them in at least one dimension, forming rails or grooves. Although FIG. 3A shows optical wafer 54 mounted to top face 45 of optoelectronic wafer 42, optical wafer 54 may also be mounted to bottom face 46 of optoelectronic wafer 42.

In many cases it may be preferable to fabricate optical elements 30 on optical wafer 54 before mounting onto optoelectronic wafer 42. This sequence minimizes the amount of processing to be performed while having optoelectronic wafer 42 and optical wafer 54 in contact. To maximize efficiency in mounting optical wafer 54 to optoelectronic wafer 42, certain choice of materials may be advantageous. For example, it is preferable for optical wafer 54 to have a thermal expansion coefficient close to that of optoelectronic wafer 42 in order to achieve precise alignment over the entire area and over a wide range of temperatures. An example of two such materials having similar thermal expansion coefficients are gallium arsenide, an often used optoelectronic wafer material, and sapphire, which is a good optical material. It is also possible to temperature tune two wafers at the time of contacting to achieve alignment over the whole area. Preferably, a single temperature for both wafers exists in which precise alignment occurs over the whole area. If the thermal expansion coefficients are too dissimilar or if large temperature variations are required for subsequent processing, steps may be necessary to prevent either wafer from being damaged or contact to be broken. A major portion of the thickness of optoelectronic wafer 42 or of optical wafer 54 may be removed, thereby forcing the thinned wafer to expand or contract with the other wafer. Thus, all or part of substrate 43 may be removed. Epitaxial liftoff, or selective etching or other means, may be employed to remove all or part of substrate 43.

Early removal of optical chip separations 60 or optoelectronic chip separation regions 50 after mounting may reduce problems resulting from different rates of thermal expansion. The mounting techniques described herein are also applicable to mounting of other types of wafers or frames subsequently described.

Figure 3B:
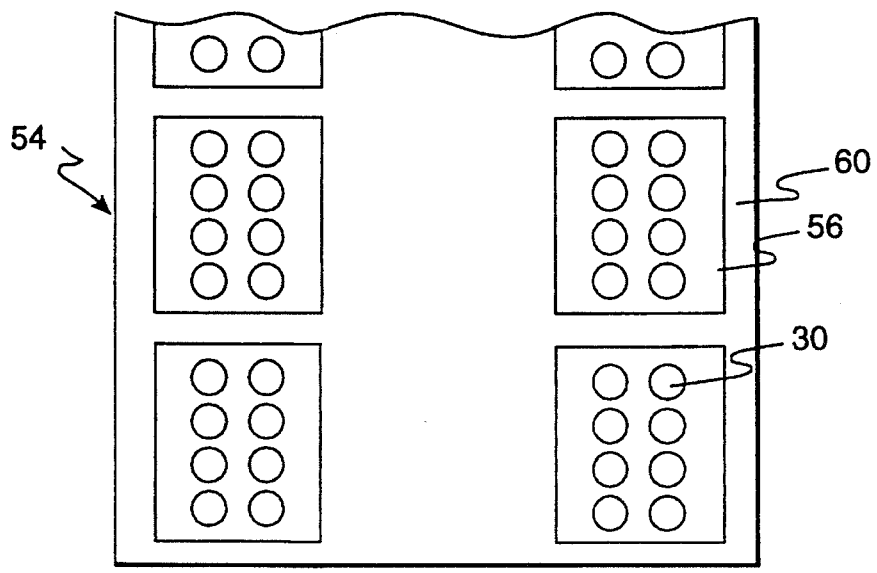
FIG. 3B is a top planar view of an optical wafer comprising microlens arrays, showing sections of the optical wafer to be removed.

FIG. 3B shows a top planar view of optical wafer 54, illustrating the two-dimensional nature of optical chips 56 and optical chip separation regions 60.

Figure 4:
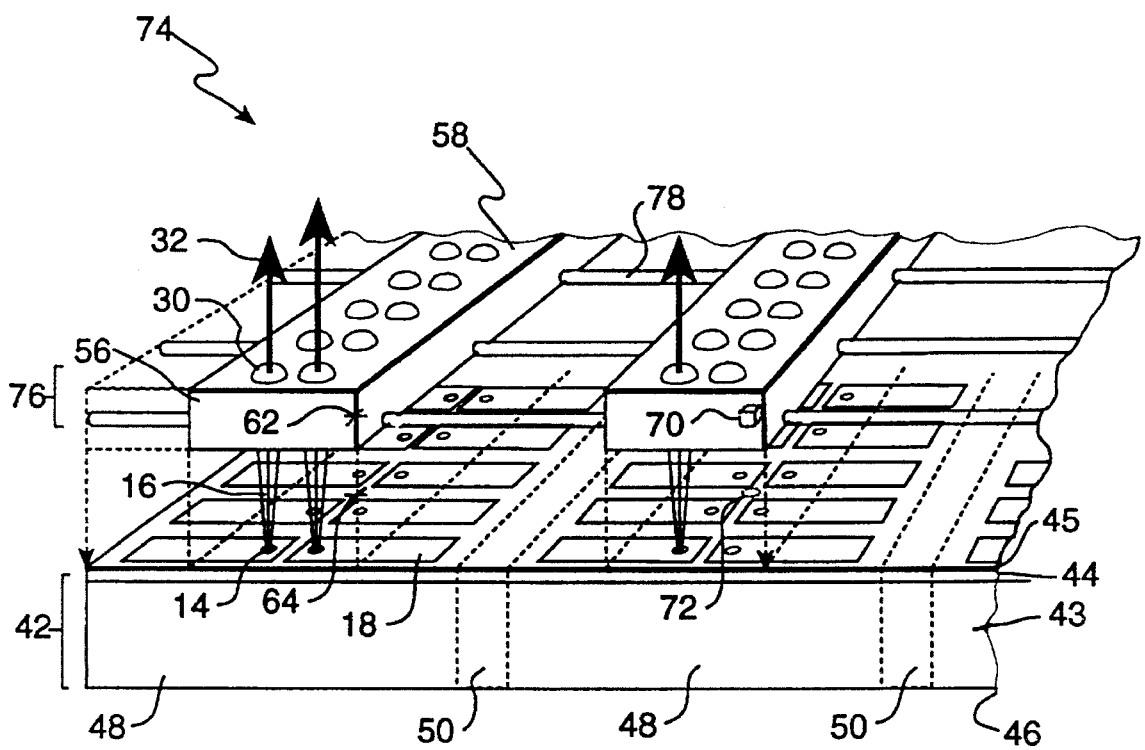
FIG. 4 is an isometric sectional view of a vertical-cavity surface-emitting laser array wafer integrated with a microlens array optical frame.

Referring now the FIG. 4, there is shown a frame wafer package 74 comprising optical frame 76 and optoelectronic wafer 42. Optical frame 76 may be mounted to optoelectronic wafer 42 using the same techniques described for the mounting of optical wafer 54 to optoelectronic wafer 42. The main difference between optical frame 76 and optical wafer 54 is that optical frame 76 comprises frame elements 78 generally corresponding to optical chip separation regions 60. Frame elements 78 may be removed prior to sectioning of optoelectronic wafer 42 into chips, as would be optical chip separation regions 60. However, in some cases it may not be necessary to remove frame elements 78 in order to section optoelectronic wafer 42. While frame elements 78 may comprise the same material as optical chips 56, it is possible to first fabricate an optical wafer 54, then perform etching, drilling or other steps to convert optical wafer 54 into an optical frame 76. Optical frame elements 78 may also comprise different material than optical chips 56. In some cases, frame elements 78 may be removed from optical chips 56 by mechanical or other means after mounting onto optoelectronic wafer 42. It may then be possible to re-use optical frame 76. Although not shown, it is also possible for optoelectronic wafer 42 to be sectioned into optoelectronic chips 12 and mounted on to a frame similar to optical frame 78 prior to integration with optical chips 56. Frame mounting of optoelectronic chips 12 may also be used in integration with optical wafer 54.

While FIGS. 3 and 4 illustrate optical chip regions 56 which are smaller in extent than optoelectronic chip regions 48, it is also possible for optical chip regions 56 to be larger in extent than optoelectronic chip regions 48. In this case, it is desirable for optical chip regions 56 to contain electrical contacts 18 which are electrically connected to optoelectronic elements 14 and which are accessible for example, for bonding to metallic strips 22. Optical chip regions may further contain electrical interconnection patterns (not shown) which may provide electrical contact between multiple optoelectronic chip regions 48, or electrical contact with electronic chips. In this case, a hybrid package element is formed with a passive element having optical and electrical functions. In general, the morphologies of optoelectronic chip regions 48 and optical chip regions 56 are exchangeable, as are the use of chip separation regions or frame elements. Furthermore, any combination of morphologies or chip separation means (i.e., chip separation regions or frame elements) may be employed.

Figure 5:
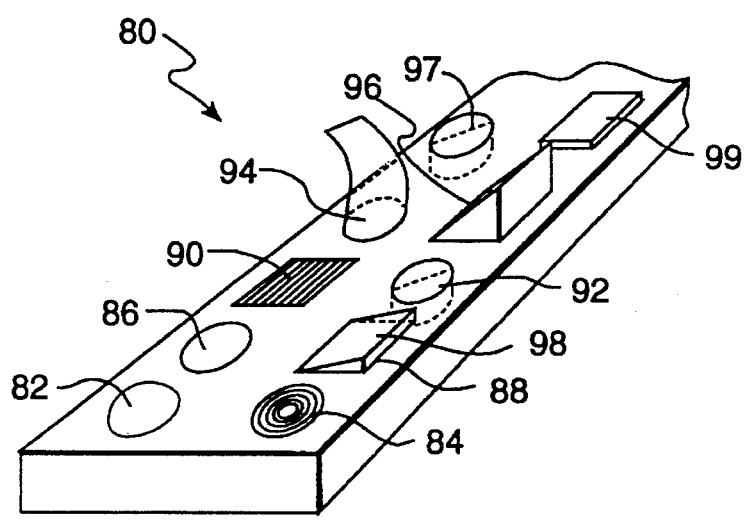
FIG. 5 is an isometric sectional view of an optical chip containing an exemplary assortment of optical components.

Referring now to FIG. 5, there is shown generic optical chip 80 comprising some of the optical elements which may be incorporated into the present invention: refractive lens 82, diffractive lens 84, gradient index lens 86, prism 88, diffraction grating 90, optical waveguide 92, optical fiber 94 and mirror 96. It should be understood that the illustrated optical components are merely demostrative of well known optical components and the invention is intended to incorporate all optical components known to those skilled in the art. FIG. 5 further illustrates that more than one type of optical component may be integrated within the same generic optical chip 80. Furthermore, for a given type of optical element, different elements may have different characteristics, for example, lens focal lengths, prism deflection angles or grating periods. Prism top surface 98 of prism 88 may also reflect light, for example, back onto a photoreceiver on optoelectronic chip 12. Mirror 96 may comprise a solid transparent material, or may be open. Other optical elements may be integrated such as frequency doublers 97 or lasers 99. Optical elements may be fabricated by many techniques, including but not limited to: molding, photoresist patterned etching, photo-induced etching, laser ablation, photoresist melt, embossing, holographic formation, ion diffusing, etc. Lens elements may modify light in any of the following design configurations: conveying, diverging, hybrid achromatic, diverging then conveying for compactness, or other configurations.

Figure 6:
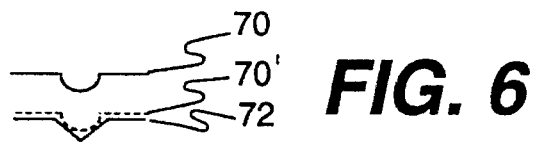
FIG. 6 is a cross-sectional view illustrating one example of a self guided projection/hole arrangement for the laser array of FIG. 6A.
Figure 6A:
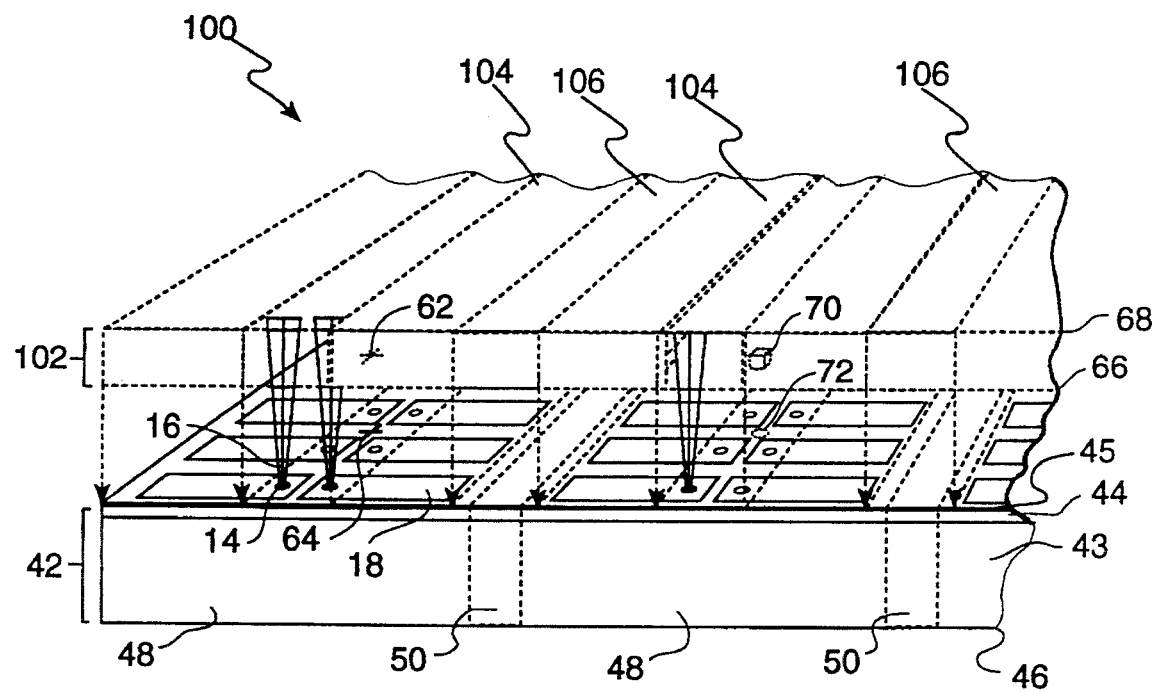
FIG. 6A is an isometric sectional view of a vertical-cavity surface-emitting laser array wafer integrated to an electronic wafer containing electronic circuits in each chip region, showing sections of the electronic wafer to be removed.

Referring now to FIG. 6A, there is shown a hybrid package 100, chiefly comprising optoelectronic wafer 42 and electronic wafer 102. Electronic wafer 102 comprises electronic chip regions 104 and electronic chip separation regions 106, which are analogous to previously described optical chip regions 56 and optical chip separation regions 60, respectively, except they may differ in relative size and shape. Electronic chip regions 104 comprise electronic circuitry (not shown, but well known in the art), for example logic circuitry, drivers, detectors, amplifiers, dividers, etc. Electronic wafer 102 may be aligned to optoelectronic wafer 42 through use of alignment marks 62 and 64, or through use of projections 70 and holes illustrated in FIG. 6 72, or by any other method. Flip chip bonding may be advantageously used to provide electrical contact between electronic chip regions 104 and optoelectronic chip regions 48. Flip chip bonding may also be used to align the two wafers 42 and 102. Alternate or additional means for bonding wafers 42 and 102 may be employed, for example, with adhesive or by fusion.

Figure 6B:
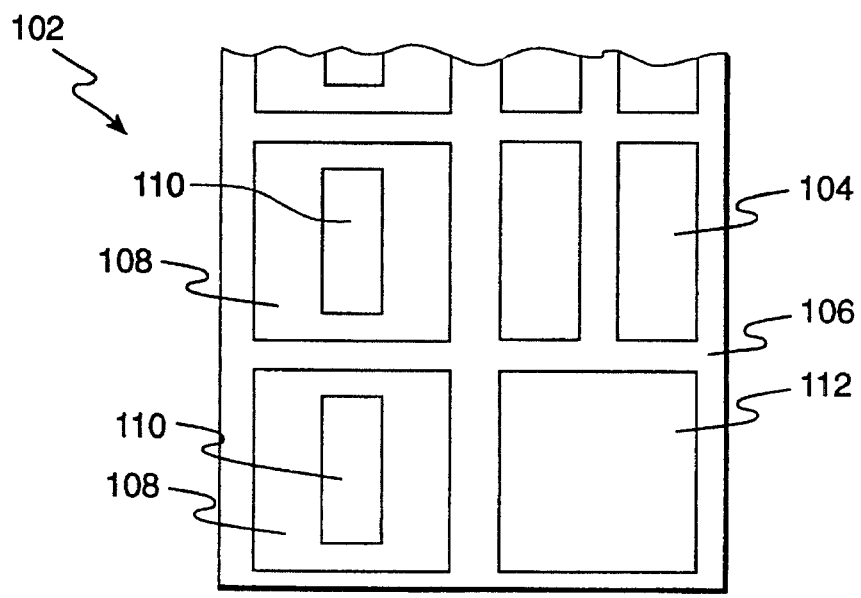
FIG. 6B is a top planar view of an electronic wafer, showing sections of the electronic circuit wafer to be removed.

FIG. 6B shows a top planar view of electronic wafer 102, illustrating the two-dimensional nature of electronic chips 104 and electronic chip separation regions 106. FIG. 6B furthermore illustrates some of the possible alternate electronic chip configurations. Annular electronic chip 108 is a single electronic chip which may contact both rows of electrical contacts 18 of optoelectronic chip region 48. Beams of light 16 may emit through electronic chip hole 110. Multiple holes 110 may also be used. In some circumstances it may be acceptable to cover the light-emitting portions of optoelectronic chip regions 48 with electronic chip regions 104. Covering electronic chip region 112 illustrates this configuration which may be acceptable if the covering electronic chip region is transparent to beams of light 16 (not shown in FIG. 6B), or if beams of light 16 emit downward through optoelectronic chip region 48 and out bottom face 46.

While FIG. 6A illustrates electronic chip regions 104 which are smaller in extent than optoelectronic chip regions 48, it is also possible for electronic chip regions 104 to be larger in extent than optoelectronic chip regions 48. In this case, it is desirable for electronic chip regions 104 to contain electrical contacts 18 which are electrically connected to optoelectronic elements 14 and which are accessible for example, for bonding to metallic strips 22. In general, the morphologies of optoelectronic chip regions 48 and electronic chip regions 104 are exchangeable, as are the use of chip separation regions or frame elements. Furthermore, any combination of morphologies or chip separation means may be employed.

Figure 7:
FIG. 7 is a cross-sectional view illustrating one example of a self guided projection/hole arrangement for the laser array of FIG. 7A.
Figure 7A:
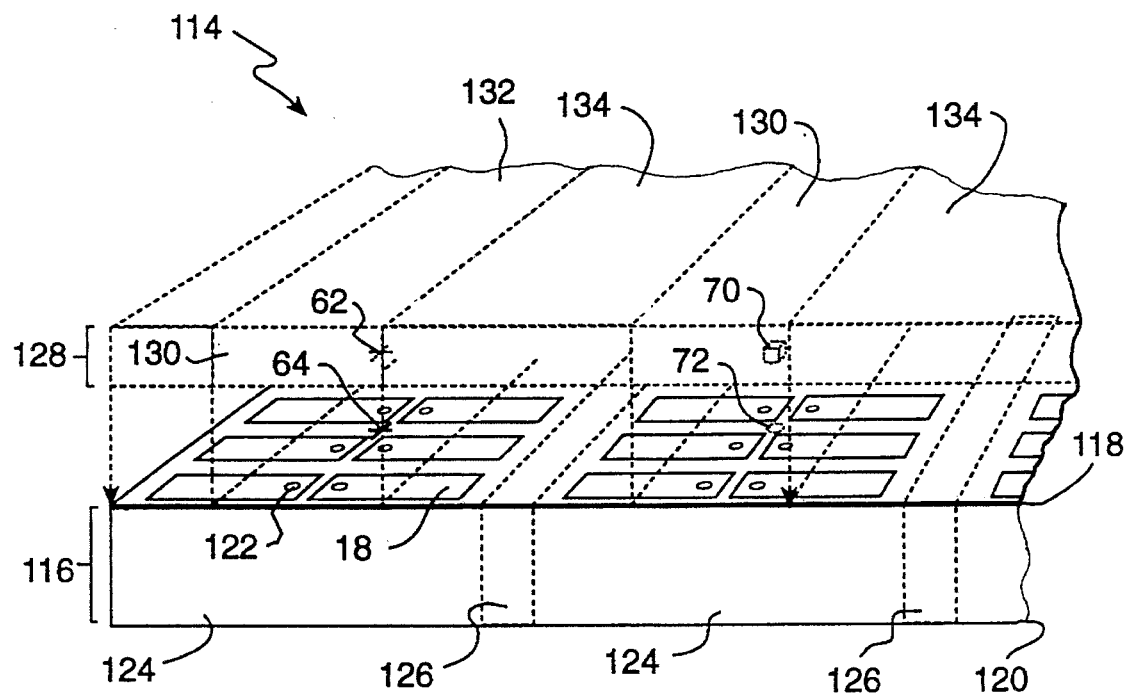
FIG. 7A is an isometric sectional view of a vertical-cavity surface-emitting laser array wafer integrated to a heatsink wafer containing heatsinks in each chip region, showing sections of the heatsink wafer to be removed.

Referring now to FIG. 7A there is shown a heatsink wafer package 114, chiefly comprising generic wafer 116 and heatsinking wafer 128. Genetic wafer 116 comprises generic elements within generic chip regions 124. Generic chip regions 124 are separated by generic chip separation regions 126. Heatsinking wafer 128 comprises heatsink regions 130 made of heatsink material 132 which are separated by heatsink separation regions 134. Preferably, when heatsink separation regions 134 are removed, electrical contacts 18 will be accessible. There is usually not a need for precise alignment between generic wafer 116 and heatsink wafer 128, however, they may be aligned in the manners previously described.

Figure 7B:
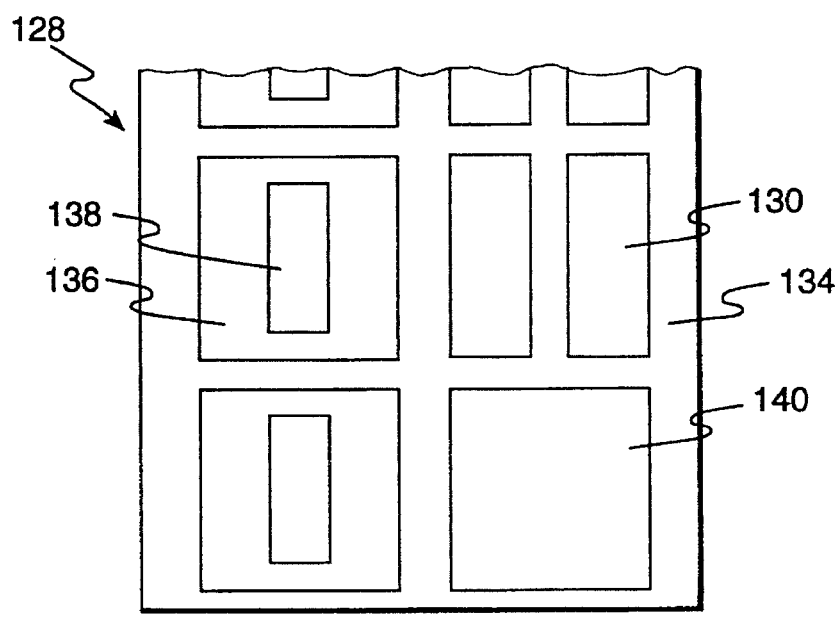
FIG. 7B is a top planar view of a heatsink wafer, showing sections of the heatsink wafer to be removed.

FIG. 7B shows a top planar view of heatsink wafer 128, illustrating the two-dimensional nature of heatsink regions 130 and heatsink separation regions 134. FIG. 7B furthermore illustrates some of the possible alternate electronic chip configurations. Annular heatsink 136 is a single heatsink which may contact both rows of electrical contacts 18 of generic chip region 124. If generic wafer 116 is optoelectronic, beams of light 16 (not shown in FIG. 7B) may propagate through heatsink hole 138. In some circumstances it may be acceptable to cover the major portions of generic chip regions 124 with heatsink regions 130. Coveting heatsink region 140 illustrates this configuration which may be acceptable if covering heatsink region 140 is transparent to beams of light 16 (not shown in FIG. 7B), or if beams of light 16 propagate through generic chip region 124 and out the bottom face 120. If generic wafer 116 is not optoelectronic, for example if it is electronic only, then it is usually acceptable and preferable for covering heatsink 140 to cover the major portion of generic chip region 124.

Figure 8:
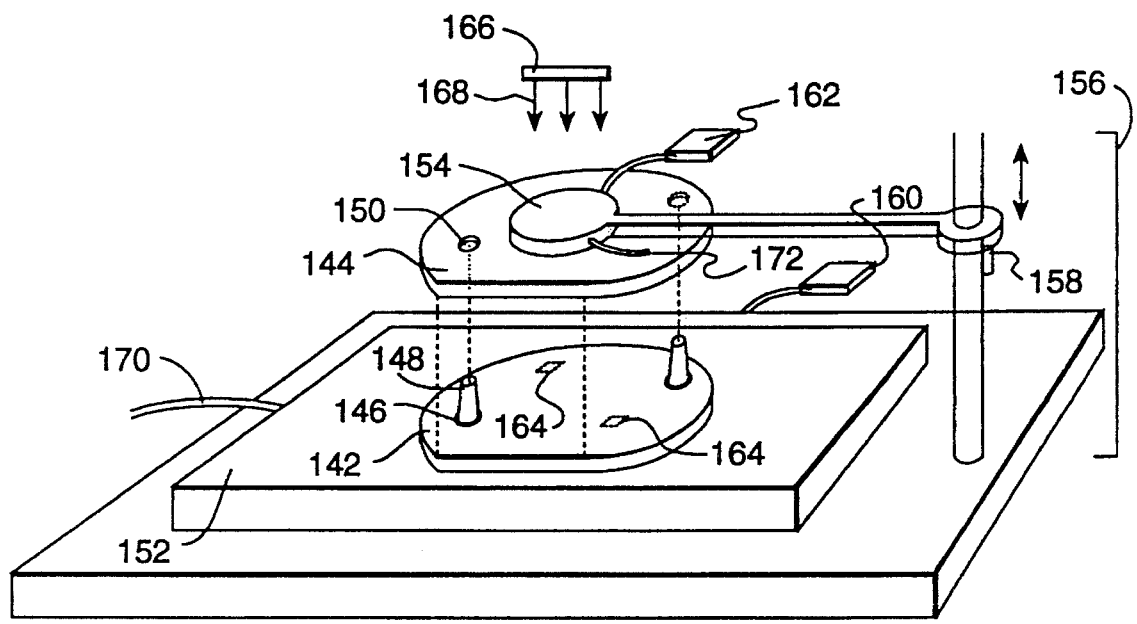
FIG. 8 is an isometric view of an apparatus for aligning and bonding two wafers through use of two pins.

Referring now to FIG. 8, there is shown a method for aligning and bonding first wafer 142 to second wafer 144, using means which has not yet been described. In this and subsequently described mounting methods, unless otherwise stated wafers 142 and 144 are generic; i.e., either of them may be electronic, optoelectronic, heatsinking, or having any other function. In the present method, wafer 142 contains holes 146 through which pins 148 may pass. Second wafer 144 has similar holes 150. Holes 146 on first wafer 142 are fabricated to be in alignment with holes 150 on second wafer 144, and pins 148 fit in holes 146 and 150 such that all components on first wafer 142 are brought into alignment with all components on second wafer 144. Preferably, pins 148 are commonly mounted on a first chuck 152. Then first wafer 142 may be placed on first chuck 152 with pins 148 passing through holes 146. Second wafer 144 may be held on second chuck 154 and placed over first wafer 142 with pins 148 passing through holes 150. This method permits rapid passive alignment. To facilitate the mounting of the wafers 142 and 144, first chuck 152 and second chuck 154 may be commonly held by stage assembly 156. The distance separating first wafer 142 from second wafer 144 may be varied, preferably with the use of position sensor 158. Either wafer may be held to either chuck by, for example, vacuum techniques or any other means known in the securing art. Preferably, pins 148 may be tapered such that stage assembly 156 needs only rough positioning precision and pins 148 will guide second wafer 144 into precise alignment with first wafer 142. In this case, holes 150 may be smaller in diameter than holes 146. Although second chuck 154 is illustrated to be smaller than second wafer 144, second chuck 154 may be larger than second wafer 144 as long as chuck 154 does not interfere with passage of pins 148 through holes 150. This may be accomplished, for example, by having similarly placed holes in second chuck 154 or by having pins 146 sufficiently short so as not to pass completely through second wafer 144. Holes 146 or holes 150 may be fabricated, for example, by etching or drilling, and are preferably located precisely with respect to elements fabricated on each respective wafer. Following a bonding process, the wafer package comprising first wafer 142 and second wafer 146 is integrated together and may be removed from first chuck 152 for subsequent processing and sectioning.

It is possible for first chuck 152 to have its temperature modified by first temperature controller 160 or for second chuck 154 to have its temperature modified by second temperature controller 162. Control of one or both temperatures may be used to match wafer sizes and achieve precise alignment over the whole area, as previously described. Heating may also be employed, for example, for setting adhesives (not shown) or for fusing solder bump bonds 164. Bump bonds 164, although illustrated only on first wafer 142, would be present on both wafers and may perform any or all of several functions such as achieving electrical connection between the two wafers or performing precise alignment. Also shown in FIG. 8 is light source 166 which emits light beams 168. Light beams 168 may be used, for example, for setting ultra-violet-light-curing epoxy. Alternatively, light beams 168 may be intense, such as from a powerful laser, and selectively apply light for light-sensitive curing of adhesives or for creating localized or broad area heating. First chuck 152 may furthermore be electrically conductive and have an electrical connection 170, or second chuck 154 may be electrically conductive and have electrical connection 172.

Figure 9:
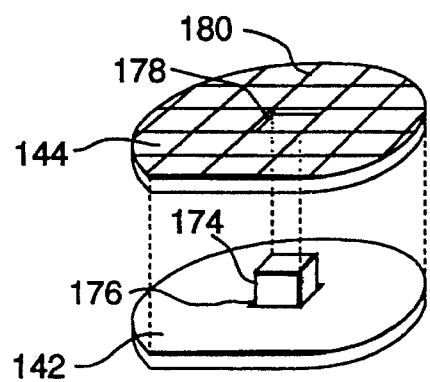
FIG. 9 is an isometric view of a noncircular pin used for the alignment of two wafers.

Although FIG. 8 illustrates the use of two, nominally cylindrical, pins 148, it is possible to use more than two pins 148. FIG. 9 shows use of a single noncircular pin 174 which may pass through noncircular hole 176 in first wafer 142 and through noncircular hole 178 in second wafer 144. It is also possible to employ more than one noncircular pin 174. Noncircular holes 176 and 178 may advantageously coincide with the position of one or more chip regions on each of wafers 142 and 144. If holes of any shape are present completely through both wafers 142 and 144, the presence of the holes may inhibit further processing, since photoresist may not spin evenly over wafers having holes in them. In particular, patterning of etch masks which allow patterned etching of chip separation regions on either wafer may often be desired, and such masks are generally formed through photoresist spinning and photolithography. To circumvent this problem, such mask patterning and formation may be advantageously performed prior to the etching of the holes. Then, after integrating first wafer 142 to second wafer 144, patterned etching of the chip separation regions may take place directly. FIG. 9 illustrates the pre-formed mask pattern 180 for the patterned etching of chip separation regions on second wafer 144.

Figure 10A:
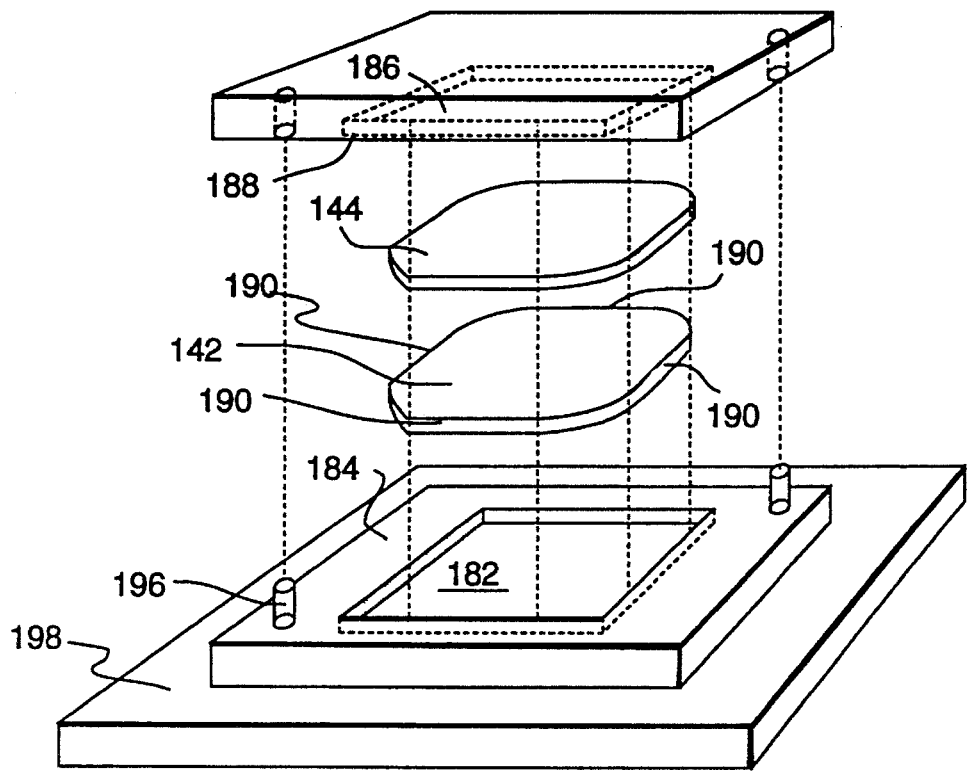
FIG. 10A is an isometric view of an apparatus for aligning and bonding two wafers through use of recessed holders.

Referring now to FIG. 10A, there is shown an alternative means for mounting first wafer 142 to second wafer 144. First wafer 142 fits precisely into recess 182 of first chuck 184 and second wafer 144 fits precisely into recess 186 of second chuck 188. Preferably, first chuck 184 chiefly comprises the same material which chiefly comprises first wafer 142, and second chuck 188 chiefly comprises the same material which chiefly comprises second wafer 144. By using same materials for each chuck and its wafer, problems due to differential thermal expansion may be avoided. Alternatively, each chuck may comprise a material with a similar thermal expansion coefficient as the respective wafer material. Either wafer 142 or 144 may be precisely aligned to its respective chuck 184 or 188 by, for example, etching flat edge 190 which are precisely located with respect to the fabricated chip regions 192.

Figure 10B:
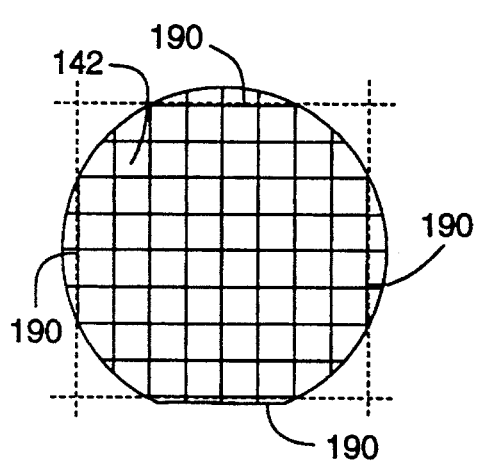
FIG. 10B is a top planar view of a wafer, showing chip regions and boundaries for the formation of four flat sides which allows the wafer to fit precisely into a recessed holder.

FIG. 10B is a top view of wafer 142 or 144 which illustrates a possible configuration for chip regions 192 and flat edges 190. Recesses 182 and 186 may be patterned in chucks 184 and 188 by, for example, photolithographic patterning and etching, to form precisely fitting recesses. Importantly, after formation of flat edges 190, the alignment of wafer 142 or 144 into recess 182 or 186 is independent of any details of the formation of the pre-processed wafer, e.g., variation in diameter. The rectangular shapes of recesses 182 and 184 illustrates one way to achieve this independence from the original wafer formation. Alignment of the rectangular faces of the recess is only with respect to flat edges 190 formed in reference to the fabricated chip regions. Given that there may be some tolerance, on the order of a micrometer, in the sizes of recesses 182 and 186 with respect to wafers 142 and 144, the possibility of a wafer being too large to fit into a recess should be avoided.

Figure 10C:
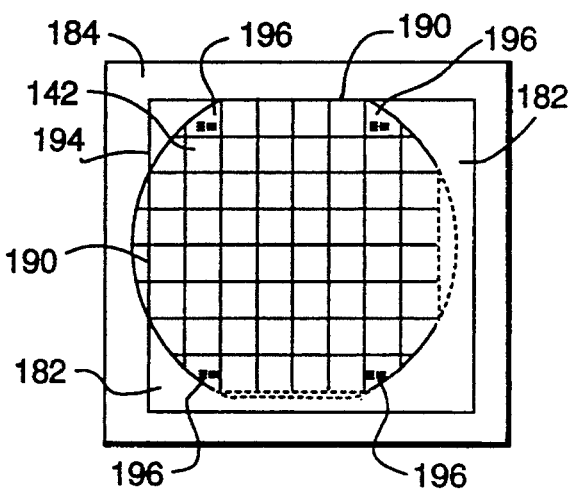
FIG. 10C is a top planar view of a wafer having two flat sides in a recessed holder.

FIG. 10C illustrates one way to achieve precise positioning while insuring that a wafer 142 or 144 fits into a recess and has no stress exerted on it. Boundary 194 of recess 182 is made larger than the maximum extent of wafer 142, and wafer 142 is located in one of the corners of recess 182 against only two of the boundaries 194 of recess 182. Thus no compressive stresses may be exerted which otherwise might break wafer 142, and positional alignment is not compromised. Use of this positioning may also reduce or eliminate the need for thermal expansion coefficient matching between chuck 184 and wafer 142. It is also seen in FIG. 10C that "corner positioning" requires only two flat edges 190.

Alignment of first chuck 184 to second chuck 188 may be accomplished through the use of pins 196 mounted on stage 198 using techniques previously described. In order to improve the alignment precision for any of the configurations shown in FIGS. 8 through 10, alignment marks 196 on wafers 142,144 may be used as shown in FIG. 10C on wafer 142.

Figure 11:
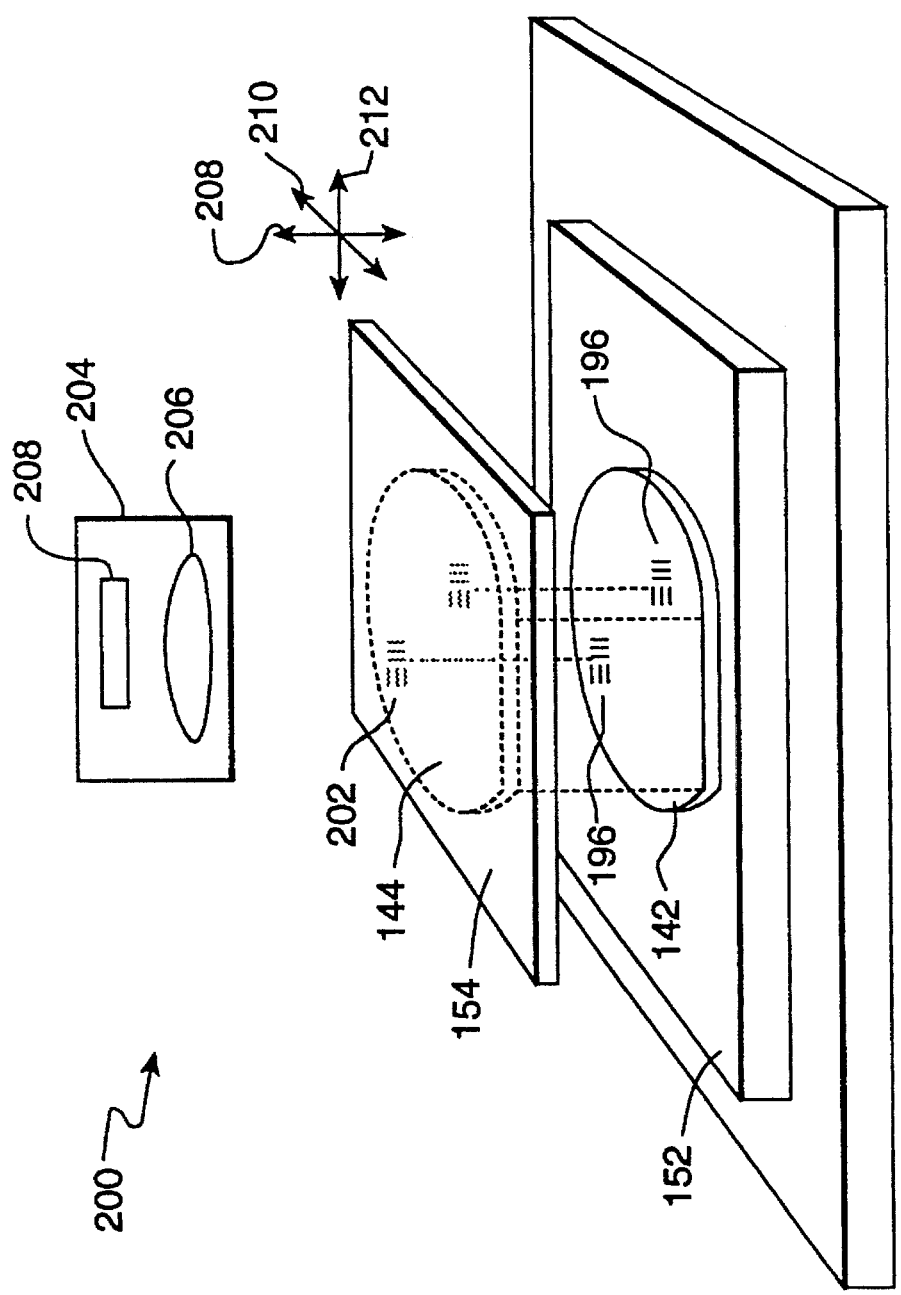
FIG. 11 is an isometric view of an apparatus for aligning and bonding two wafers through use of alignment marks on both wafers.

Referring now to FIG. 11, there is shown an alignment assembly 200 for aligning and mounting wafers 142 and 144. Use of alignment marks 196 and 202 with alignment sensor 204 allows direct comparison of the relative positions of wafers 142 and 144. Alignment sensor 204 may comprise an optical system 206 and a detector 208. Alignment sensor 204 may also comprise multiple sensors for position determination in multiple directions or with rough and precise accuracy. It is well known in the art that in some semiconductor processing photolithographic steppers, alignment marks on wafers are designed to match corresponding alignment marks on photolithographic masks such that an alignment sensor senses the relative position and translates the mask or wafer into alignment. Such alignment techniques are generally termed "active alignment." Similar methods may be employed to align two wafers, for example wafers 142 and 144 as shown in FIG. 11. Alignment assembly 200 may have capability for translating either or both of wafers 142 or 144 in a vertical direction 208 or in horizontal direction 210 or horizontal direction 212. Use of alignment assembly 200 with alignment marks 196 and 202 eliminates the need for creating holes or flat faces in the wafers, and eliminates the need for close thermal compatibility between any of the wafers 142,144 and their respective stages 152, 154.

Active alignment may be implemented into any of the alignment configurations illustrated in FIGS. 8 through 11. Furthermore, any of the features illustrated in FIG. 8 may be implemented with any of the described alignment techniques, for example temperature controllers 160 or 162, light source 166 or electrical connections 170 or 172. While the techniques illustrated in FIGS. 8 through 11 have been described in the context of aligning and mounting two wafers, the techniques are equally valid for aligning a frame structure to a wafer, a wafer to a frame structure or a frame structure to a frame structure.

Figure 12A:
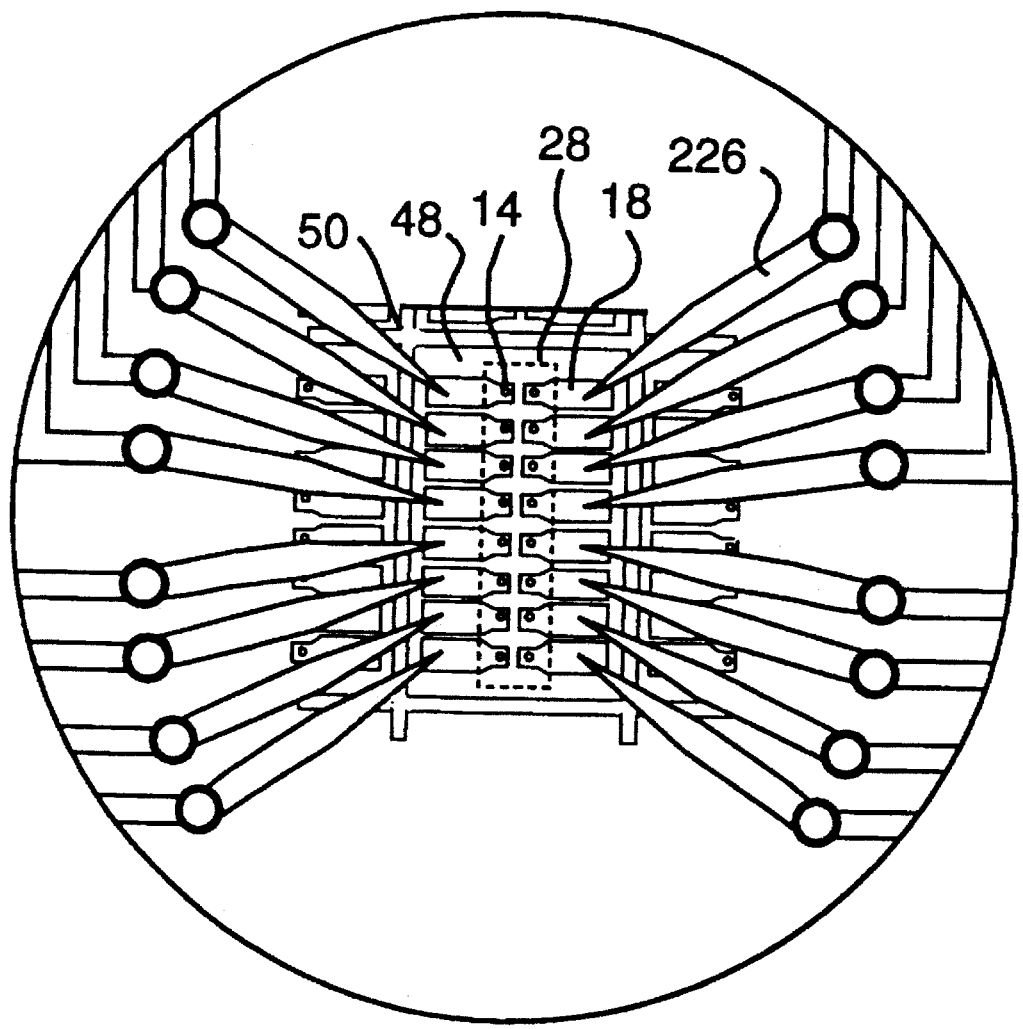
FIG. 12A is an enlarged view of the inset of FIG. 12 which illustrates the outline of one of the optical chips of the optoelectronic wafer under test.

Referring now to FIG. 12, there is shown wafer package tester 222 which may characterize any or all of the wafer-level pre-packaged optoelectronic elements 14, electronic circuitry, or any other device or circuit which is fabricated on wafers. Wafer package tester 222 is illustrated in FIG. 12 for testing a pre-packaged optoelectronic wafer 42. Wafer package tester 222 comprises a probe card 224 containing one, or preferably more than one, electrical probes 226 which may access electrical contacts 18. Shown in the inset of FIG. 12A is the outline of optical chip 28, illustrating the coverage of optical elements 14 and accessibility of electrical contacts 18. As shown, beams of light 16 are collected by lens 228, split by beamsplitter 230 and directed to photodetector 232 and video camera 234. Beam profiles may be viewed on video monitor 236, and optical power may be monitored by photodetector 232. Both the profile and power information may be sent to central processing unit CPU or computer 238 for analysis and control of the wafer package tester 222. Control information from CPU or computer 238 is sent to switch matrix unit SMU 240, routed through switch matrix 242 and to probe card 224. Optoelectronic wafer 42 is mounted on translation stage 244 which is moveable on translator platform 246. Illustrated are a first position 248 and a second position 250. Wafer package tester 222 is illustrative of some of the possibilities for wafer testing. Other features, for example an optical fiber probe and spectrometer for characterizing spectral information, may be straightforwardly implemented. Wafer package tester 222 may also be configured to characterize light emitted through bottom face 46 of optoelectronic wafer 42, or to send light incident onto optoelectronic wafer 42 in the case where optoelectronic elements 14 are receiving elements. If an electronic wafer is being tested, the optical apparatus is not necessary.

The invention described herein is well-suited for many applications including laser printing, optical storage, optical communications, medical optics, displays, laser scanning and laser processing.

It is to be appreciated and understood that the specific embodiments of the invention are merely illustrative of the general principles of the invention. Various modifications may be made upon the preferred embodiments described consistent with the principles set forth. A large parameter space exists, containing a large number of independent possibilities for components, wafers, optical elements, contacts, integration methods, etc. Rather than describe all possible combinations, a partial outline of the parameter space is presented here.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as defined by the appended claims, unless they depart therefrom.

What is claim is:

1. An optoelectronic package comprising:
   at least a portion of a first layer having at least a top surface which contains at least two optoelectronic chip regions, each of said optoelectronic chip regions containing at least one optoelectronic element which receives or emits at least one beam of light and receives or emits at least one electronic signal, each of said optoelectronic chip regions containing at least one electrical contact;
   means for separating said optoelectronic chip regions; and
   a medium comprising medium regions integrated with and aligned with said optoelectronic chip regions, each of said medium regions containing modifying elements which modify said at least one beam of light or said at least one electronic signal, at least one of said medium regions comprising at least a portion of a second layer having at least a top surface which contains at least two electronic chip regions, each of said electronic chip regions containing at least one electronic element electrically connected to said at least one optoelectronic element, each of said electronic chip regions containing at least one electrical contact;
   characterized in that said medium regions are commonly mounted when integrated to said optoelectronic chip regions, and that said at least one electrical contact is electrically accessible.

2. The optoelectronic package recited in claim 1 wherein said optical material is selected from the group consisting of photoresit, polyimide and spin cast glass.

3. The optoelectronic package recited in claim 1 wherein at least one of said electrical contacts is a wire bonding pad.

4. The optoelectronic package recited in claim 1 wherein at least one of said electrical contacts is a bump bonding pad.

5. The optoelectronic package recited in claim 1 wherein at least one of said electrical contacts is a tape automated bonding pad.

6. The optoelectronic package recited in claim 1 wherein at least one of said electrical contacts is a via through said first layer.

7. The optoelectronic package recited in claim 1 wherein at least one of said optical elements comprises at least one lens.

8. The optoelectronic package recited in claim 1 wherein said least one optical element comprises at least one prism.

9. The optoelectronic package recited in claim 1 wherein said at least one optical element comprises at least one grating.

10. The optoelectronic package recited in claim 1 wherein said at least one optical element comprises at least one reflector which reflects at least some of said at least one beam of light.

11. The optoelectronic package recited in claim 1 wherein said at least one optical element comprises a waveguide.

12. The optoelectronic package recited in claim 1 wherein said at least one optical element comprises a refractive element.

13. The optoelectronic package recited in claim 1 wherein said at least one optical element comprises a diffractive element.

14. The optoelectronic package recited in claim 1 wherein said at least one optical element comprises a gradient index element.

15. The optoelectronic package recited in claim 1 wherein said optical material is partitioned.

16. The optoelectronic package recited in claim 1 wherein at least one of said electrical contacts is not covered by said optical material.

17. The optoelectronic package recited in claim 1 wherein at least one of said optoelectronic elements comprises a modulator.

18. The optoelectronic package recited in claim 1 wherein at least one of said optoelectronic elements comprises a light emitting diode.

19. The optoelectronic package recited in claim 1 wherein at least one of said optoelectronic elements comprises a laser.

20. The optoelectronic package recited in claim 19 wherein said laser comprises a vertical cavity surface emitting laser.

21. The optoelectronic package recited in claim 1 wherein said optical material is selected from the group consisting of silicon nitride, silicon dioxide, titanium dioxide, aluminum gallium arsenide and indium phosphide.

22. The optoelectronic package recited in claim 1, further comprising an insulating layer disposed between portions of said optoelectronic chip regions and said electronic chip regions.

* * * * *